(12) United States Patent
Gao et al.

(10) Patent No.: US 9,812,579 B2
(45) Date of Patent: Nov. 7, 2017

(54) THIN FILM TRANSISTOR, METHOD OF FABRICATING THE SAME, ARRAY SUBSTRATE AND DISPLAY DEVICE

(71) Applicant: BOE TECHNOLOGY GROUP CO., LTD., Beijing (CN)

(72) Inventors: Jincheng Gao, Beijing (CN); Bin Zhang, Beijing (CN); Xiaolong He, Beijing (CN); Xiangchun Kong, Beijing (CN); Qi Yao, Beijing (CN); Zhanfeng Cao, Beijing (CN); Zhengliang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/149,587

(22) Filed: May 9, 2016

(65) Prior Publication Data
US 2016/0336458 A1    Nov. 17, 2016

(30) Foreign Application Priority Data

May 11, 2015    (CN) .......................... 2015 1 0236089

(51) Int. Cl.
*H01L 29/786* (2006.01)
*H01L 29/45* (2006.01)
(Continued)

(52) U.S. Cl.
CPC ...... *H01L 29/78606* (2013.01); *H01L 27/127* (2013.01); *H01L 27/1225* (2013.01);
(Continued)

(58) Field of Classification Search
CPC ............. H01L 27/1255; H01L 27/3248; H01L 29/786; H01L 27/1214; H01L 29/4908;
(Continued)

(56) References Cited

U.S. PATENT DOCUMENTS

2003/0222319 A1    12/2003    Azuma
2006/0038176 A1*    2/2006    Akimoto ........... G02F 1/136227
                                                              257/59
(Continued)

FOREIGN PATENT DOCUMENTS

CN    1661651 A    8/2005
CN    102097381 A    6/2011
(Continued)

OTHER PUBLICATIONS

European Search Report dated Sep. 22, 2016.
Chinese Office Action dated Apr. 1, 2017.

*Primary Examiner* — Caleen Sullivan
(74) *Attorney, Agent, or Firm* — Dilworth & Barrese, LLP; Michael J. Musella, Esq.

(57) ABSTRACT

A thin film transistor, a method of fabricating the same, an array substrate and a display device are disclosed. The method of fabricating the thin film transistor comprises: forming a semiconductor layer; forming a conductive film that does not react with acid solution on the semiconductor layer to be employed as a protective layer; forming a source electrode and a drain electrode on the protective layer; and removing a portion of the protective layer between the source electrode and the drain electrode to expose a portion of the semiconductor layer between the source electrode and the drain electrode.

9 Claims, 3 Drawing Sheets

(51) Int. Cl.
*H01L 27/12* (2006.01)
*H01L 29/66* (2006.01)

(52) U.S. Cl.
CPC ........ *H01L 29/45* (2013.01); *H01L 29/66969* (2013.01); *H01L 29/7869* (2013.01); *H01L 29/78618* (2013.01); *H01L 29/78693* (2013.01); *H01L 29/78696* (2013.01)

(58) Field of Classification Search
CPC ......... H01L 29/78693; H01L 29/41733; H01L 27/3272; H01L 29/78618; H01L 23/552; H01L 27/3258; H01L 29/78606; H01L 27/1225; H01L 27/127; H01L 29/78696; H01L 29/7869; H01L 29/45; H01L 29/66969; G02F 1/136227
USPC ...................................... 438/104; 257/59, 88
See application file for complete search history.

(56) References Cited

U.S. PATENT DOCUMENTS

2006/0049402 A1   3/2006  Lee et al.
2014/0147967 A1   5/2014  Park et al.

FOREIGN PATENT DOCUMENTS

| CN | 102774065 A | 11/2012 |
| CN | 103855030 A | 6/2014 |
| JP | S6229166 A | 2/1987 |

\* cited by examiner

THIN FILM TRANSISTOR, METHOD OF FABRICATING THE SAME, ARRAY SUBSTRATE AND DISPLAY DEVICE

TECHNICAL FIELD

At least one embodiment of the present disclosure relates to a thin film transistor, a fabricating method of the thin film transistor, an array substrate and a display device.

BACKGROUND

In recent years, display device develops at a high speed. Thin film transistor, serving as a driving element of the display device, has developed from a-Si (non-crystal silicon) thin film transistor to LTPS (low temperature poly-silicon) thin film transistor and oxide thin film transistor, etc.

The oxide thin film transistor is widely used at present, employs an oxide semiconductor as an active layer, and has advantages of high mobility, high on-state current, better property as a switch, high uniformity and suitable for the display device that requires fast response and larger current, such as the display device with high frequency, high resolution or large size, and the organic light-emitting display device.

Structure of current oxide thin film transistor includes two types: etch stop layer (ESL) type and back channel etch (BCE) type. In the ESL type oxide thin film transistor, an etch stop layer is fabricated on an oxide semiconductor layer, and a via hole is etched in the etch stop layer so as to connect source and drain electrodes and the oxide semiconductor layer via the via hole. In the ESL type oxide thin film transistor, the oxide semiconductor is well protected; however, a patterning process for forming the etch stop layer is added, so that the fabrication process of the thin film transistor is complicated and the cost is increased. In addition, in the ESL type oxide thin film transistor, a channel size of the thin film transistor is limited because a distance between via holes is limited by process capability for forming the via holes and the source drain metal layer, which limits increase of aperture ratio of the display device that employs the oxide thin film transistor and limits application of the oxide thin film transistor in high PPI (pixels per inch) products. In the BCE type oxide thin film transistor, the patterning process for forming the etching a stop layer is omitted, but the oxide semiconductor layer is not protected; therefore, it is of high requirement for etching process and the oxide semiconductor layer easily becomes unstable. Hence, the BCE type oxide thin film transistor is not be widely used.

SUMMARY

According to embodiments of the disclosure, a method of fabricating a thin film transistor is provided. The method comprises: forming a semiconductor layer; forming a conductive film that does not react with acid solution on the semiconductor layer to be employed as a protective layer; forming a source electrode and a drain electrode on the protective layer; and removing a portion of the protective layer between the source electrode and the drain electrode to expose a portion of the semiconductor layer between the source electrode and the drain electrode.

For example, the conductive film is an amorphous carbon film.

For example, the amorphous carbon film is a graphite-like carbon film.

For example, in the graphite-like carbon film, C atoms in sp2 hybridization state has a percentage of 51%-100%.

For example, the removing the portion of the protective layer between the source electrode and the drain electrode comprises: removing the portion of the protective layer between the source electrode and the drain electrode comprise by a dry etching process.

For example, the removing the portion of the protective layer between the source electrode and the drain electrode comprise by the dry etching process comprises: performing an oxygen plasma etching process on the portion of the protective layer between the source electrode and the drain electrode, to remove the portion of the protective layer between the source electrode and the drain electrode.

For example, the forming the conductive film that does not react with acid solution on the semiconductor layer comprises: employing a sputtering process to form the conductive film on the semiconductor layer.

For example, in the sputtering process, a graphite target with purity greater than 99.99% is employed as a sputtering target, a vacuum degree in a sputtering chamber is 0.1-100× 10-3 Pa, a working pressure is 0.1-1 Pa, a gas flow is 25 mL/min (sccm), and a power of the graphite target is 1-2 kW.

For example, the semiconductor layer is a metal oxide semiconductor layer.

For example, the forming the source electrode and the drain electrode and the removing the portion of the protective layer between the source electrode and the drain electrode are completed by a same patterning process.

According to the embodiments of the disclosure, a thin film transistor is provided. The thin film transistor comprises: a semiconductor layer; and a source electrode and a drain electrode provided on the semiconductor layer. The semiconductor layer comprises a source area that corresponds to the source electrode, a drain area that corresponds to the drain electrode and an intermediate area that is provided between the source area and the drain area and corresponds to a gap between the source electrode and the drain electrode. The thin film transistor further comprises a conductive film that does not react with acid solution, and the conductive film is provided to connect the source area and the source electrode and to connect the drain area and the drain electrode.

For example, the conductive film is an amorphous carbon film.

For example, wherein, the amorphous carbon film is a graphite-like carbon film.

For example, wherein, in the graphite-like carbon film, C atoms in sp2 hybridization state has a percentage of 51%-100%.

For example, a thickness of the amorphous carbon film is 10-1000 nm.

For example, a resistivity of the amorphous carbon film is $1 \times 10^{-6} - 6 \times 10^{-5}$ Ω·m.

For example, a resistivity of the intermediate area is 1.06-1.09 Ω·m, and a resistivity of the source area and the drain area is not greater than $1 \times 10^{-5}$ Ω·m.

For example, the semiconductor layer is a metal oxide semiconductor layer.

According to the embodiments of the disclosure, an array substrate is provided. The array substrate comprises the thin film transistor as described above.

According to the embodiments of the disclosure, a display device is provided. The display device comprises the array substrate as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and, it is not limitative to the scope of the present disclosure.

DETAILED DESCRIPTION

Figure 1:
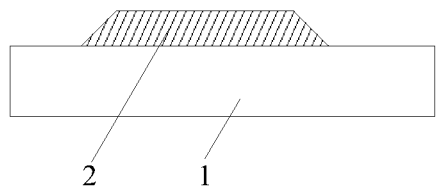
FIG. 1 is a schematic view after forming a gate electrode of a thin film transistor in embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

At least one embodiment of the present disclosure provides a thin film transistor, a method of fabricating the thin film transistor, an array substrate and a display device, in which an oxide semiconductor layer of an oxide thin film transistor is better protected and patterning processes for forming the oxide thin film transistor are decreased in comparison with the ESL type oxide thin film transistor. In addition, compared with the ESL type oxide thin film transistor, a size of a channel of the thin film transistor is decreased, which increases an aperture ratio of the array substrate employing the oxide thin film transistor and increases the application of the array substrate employing the oxide thin film transistor in high PPI product.

At least one embodiment of the present disclosure provides a method of fabricating a thin film transistor. For example, the method includes: forming a semiconductor layer of the thin film transistor; forming a conductive film that does not react with acid solution on the semiconductor layer to be employed as a protective layer; forming a source electrode and a drain electrode of the thin film transistor on the protective layer; removing a portion of the protective layer between the source electrode and the drain electrode to expose a portion of the semiconductor layer between the source electrode and the drain electrode.

For example, the portion of the protective layer between the source electrode and the drain electrode is removed by a drying etching process.

In the embodiments of the present disclosure, the conductive film that does not react with acid solution and is capable of being removed by dry etching is formed on the semiconductor layer to be employed as the protective layer; thus, the protective layer avoids adverse influence of the etching solution for forming the source and drain electrodes on the oxide semiconductor layer, so that the oxide semiconductor is protected by the protective layer. In addition, because the protective layer is conductive, it is not necessary to perform a patterning process on the protective layer to form a via hole connecting the source and drain electrodes with the semiconductor layer; instead, it is only required to remove the portion of the protective layer between the source electrode and the drain electrode of the thin film transistor by dry etching after forming the source electrode and the drain electrode, so that the patterning processes is decreased by one compared with the ESL type thin film transistor. In addition, upon employing the dry etching process to remove the portion of the protective layer between the source electrode and the drain electrode of the thin film transistor to form a channel of the thin film transistor, a size of the channel is adjusted by gas flow and etching duration in the dry etching process so that the channel size is not be limited by process capability for forming the via hole and the source and drain electrodes; therefore, compared with the ESL type thin film transistor, the channel size of the thin film transistor according to the embodiments of the disclosure is decreased, which increases the aperture ratio of the array substrate employing the oxide thin film transistor and increases the application of the array substrate employing the oxide thin film transistor in high PPI product.

For example, the conductive film is an amorphous carbon film.

For example, the removing the portion of the protective layer between the source electrode and the drain electrode by the dry etching process comprises: performing an oxygen plasma etching process on the portion of the protective layer between the source electrode and the drain electrode to remove the portion of the protective layer between the source electrode and the drain electrode.

For example, in the case that the conductive film is the amorphous carbon film, the forming the conductive film that does not react with acid solution on the semiconductor layer to be employed as a protective layer includes: employing a sputtering process to form the protective layer on the substrate that is formed with the semiconductor layer of the thin film transistor. For example, a graphite target with purity greater than 99.99% is employed as a sputtering target of the sputtering process, a vacuum degree in a sputtering chamber is $0.1\text{-}100\times10^{-3}$ Pa, a working pressure is 0.1-1 Pa, a gas flow is 25 mL/min (sccm), and a power of the graphite target is 1-2 kW.

At least one embodiment of the present disclosure provides a thin film transistor. For example, the thin film transistor comprises: a semiconductor layer; and a source electrode and a drain electrode provided on the semiconductor layer. The semiconductor layer comprises a source area that corresponds to the source electrode, a drain area that corresponds to the drain electrode and an intermediate area that is provided between the source area and the drain area and corresponds to a gap between the source electrode and the drain electrode. A conductive film that does not react with acid solution is provided to connect the source area and the source electrode and to connect the drain area and the drain electrode.

The thin film transistor according to the embodiments of the present disclosure has similar technical effects as those in the above method of fabricating the thin film transistor, which will not be explained in detail.

For example, the conductive film is an amorphous carbon film.

For example, a thickness of the amorphous carbon film is 10-1000 nm.

For example, a resistivity of the amorphous carbon film is $1\times10^{-6}$-$6\times10^{-5}$ Ω·m.

For example, a resistivity of the intermediate area is 1.06-1.09 Ω·m, and a resistivity of the source area and the drain area is not greater than $1\times10^{-5}$ Ω·m.

The embodiments of the present disclosure further provide an array substrate that comprises the thin film transistor as described above.

At least one embodiment of the present disclosure provides a display device, and the display device comprises the array substrate as described above. In addition, the display device may include other components according to practical needs, which will not be described in detail herein. For example, the display device is any product or component having display function such as a liquid crystal panel, an electronic paper, a liquid crystal TV set, a liquid crystal display, a digital photo frame, a cell phone and a tablet computer.

Hereinafter, the thin film transistor and its fabricating method in the embodiments of the present disclosure will be described in detail in combination with drawings. For example, the method of fabricating the thin film transistor in the embodiments of the present disclosure includes following steps.

Step a1: providing a base substrate 1 and forming a gate electrode 2 on the base substrate 1;

As illustrate in FIG. 1, the base substrate 1 is provided and the gate electrode 2 is formed by patterning a gate metal layer on the base substrate 1. For example, the base substrate 1 is a glass substrate or a quartz substrate.

For example, a sputtering method or a thermal evaporation method is employed to deposit the gate metal layer with a thickness of 2500-16000 Å, and the gate metal layer is formed of a metal such as Cu (copper), Al (aluminum), Ag (silver), Mo (molybdenum), Cr (chromium), Nd (neodymium), Ni (nickel), Mn (manganese), Ti (titanium), Ta (thallium) and W (wolfram) or an alloy of these metals. For example, the gate metal layer is of a single-layer structure, or the gate metal layer is of a multi-layer structure such as Cu\Mo, Ti\Cu\Ti or Mo\Al\Mo. A photoresist is coated on the gate metal layer, and then the photoresist is exposed and developed by using a single tone mask, so as to form a photoresist-removed-area and a photoresist-retained-area. The photoresist-retained-area corresponds to an area in which the gate electrode is to be formed, and the photoresist-removed-area corresponds to other areas. The gate metal layer in the photoresist-removed-area is completely etched off by a etching process, and then the photoresist in the photoresist-retained-area is removed, so that the gate electrode 2 is formed.

Figure 2:
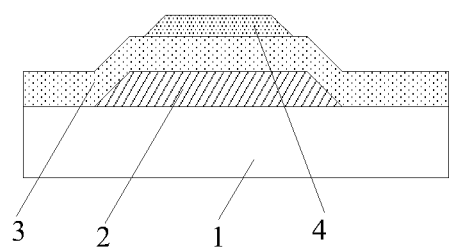
FIG. 2 is a schematic view after forming an active layer of the thin film transistor in the embodiments of the present disclosure.

Step a2: forming a gate insulation layer 3 and a semiconductor layer 4 on the base substrate 1 after step a1;

For example, as illustrated in FIG. 2, a plasma-enhanced chemical vapor deposition (PECVD) method is employed to deposit the gate insulation layer 3 with a thickness of about 2000-6000 Å on the base substrate 1 after the step a1. For example, the gate insulation layer is formed of an oxide, a nitride or an oxynitride, and has a single-layer structure, a double-layer structure or a multi-layer structure. For example, the gate insulation layer is formed of $SiN_x$, $SiO_x$ or $Si(ON)_x$.

For example, a magnetron sputtering method, a thermal evaporation method or other film formation method is employed to deposit a transparent metal oxide semiconductor layer with a thickness of 20-1000 Å on the gate insulation layer 3. The transparent metal oxide semiconductor layer for example is formed of amorphous IGZO, HIZO, InZnO, ZnO, TiO2, SnO, CdSnO or other metal oxide semiconductor material. A photoresist is coated on the transparent metal oxide semiconductor layer and is exposed and developed by using a single tone mask, and the transparent metal oxide semiconductor layer is etched to form the semiconductor layer 4 that is formed of the transparent metal oxide semiconductor.

Step a3: forming a protective layer 5 on the base substrate 1 after the step a2;

For example, the protection layer in the embodiments of the present disclosure has the following properties: it does not react with acid etching solution; it is removed by a dry etching process; and it has good conductivity. For example, the protective layer in the embodiments of the present disclosure is formed of an amorphous carbon film. For example, the amorphous carbon is a graphite-like carbon film; for example, in the graphite-like carbon film, C atoms are mainly in sp2 hybridization state, and the C atoms in sp2 hybridization state has a percentage of 51%-100%.

Figure 3:
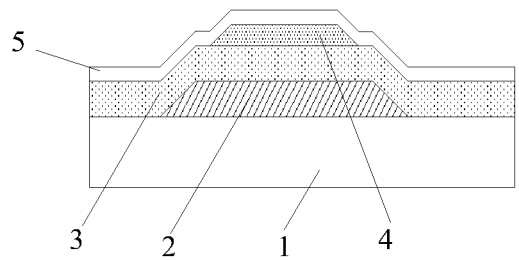
FIG. 3 is a schematic view after forming a protective layer in the embodiments of the present disclosure.

For example, as illustrated in FIG. 3, a sputtering method is employed to form the amorphous carbon film with a thickness of 10-1000 nm on the base substrate 1 after the step a2. For example, a graphite target with purity greater than 99.99% is employed as a sputtering target of the sputtering process, a vacuum degree in a sputtering chamber is $0.1$-$100\times10^{-3}$ Pa, a working pressure is 0.1-1 Pa, a gas flow is 25 mL/min (sccm), and a power of the graphite target is 1-2 kW. A resistivity of the amorphous carbon film is $1\times10^{-6}$-$6\times10^{-5}$ Ω·m.

Figure 4:
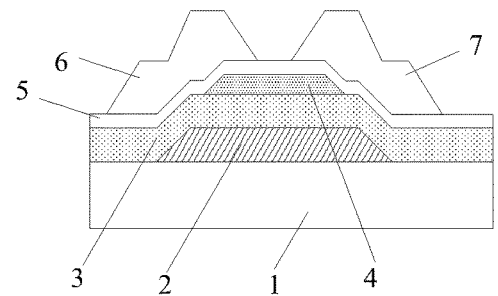
FIG. 4 is a schematic view after forming a source electrode and a drain electrode of the thin film transistor in the embodiments of the present disclosure.

Step a4: forming a source electrode 6 and a drain electrode 7 on the base substrate 1 after the step a3;

For example, as illustrated in FIG. 4, a magnetron sputtering method or a thermal evaporation method or other film formation method is employed to deposit a source drain metal layer with a thickness of 2000-6000 Å on the base substrate 1 after the step a3, and the source drain metal layer is formed of a metal such as Cu (copper), Al (aluminum), Ag (silver), Mo (molybdenum), Cr (chromium), Nd (neodymium), Ni (nickel), Mn (manganese), Ti (titanium), Ta (thallium) and W (wolfram) or an alloy of these metals. For example, the source drain metal layer has a single-layer structure; or the source drain metal layer has a multi-layer structure, such as Cu\Mo, Ti\Cu\Ti and Mo\Al\Mo. A photoresist is coated on the source drain metal layer, and the photoresist is exposed and developed by using a single tone mask to form a photoresist-removed-area and a photoresist-retained-area. The photoresist-retained-area correspond to an area in which the source electrode and the drain electrode are to be formed, and the photoresist-removed-area corresponds to other areas. The source drain metal layer in the photoresist-removed-area is completely etched off by an etching process and the photoresist in the photoresist-retained-area is removed, so that the source electrode 6 and the drain electrode 7 are formed.

In the patterning process, a wet etching process is employed to etch the source drain metal layer to form the source electrode 6 and the drain electrode 7; under such a case, since the protective layer closely cover the semiconductor layer 4, so that the protective layer prevents acid solution in the wet etching process from damaging the semiconductor layer 4.

Step a5: employing a dry etching process to remove a portion of the protective layer 5 between the source electrode and the drain electrode of the thin film transistor.

Figure 5:
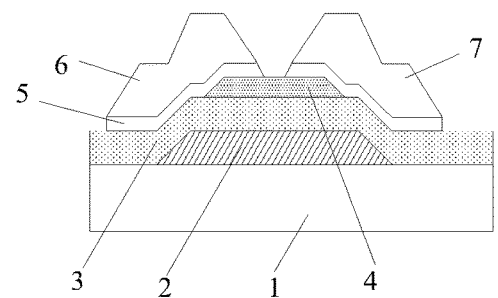
FIG. 5 is a schematic view after removing a portion of the protective layer between the source electrode and the drain electrode of the thin film transistor in the embodiments of the present disclosure.
Figure 6:
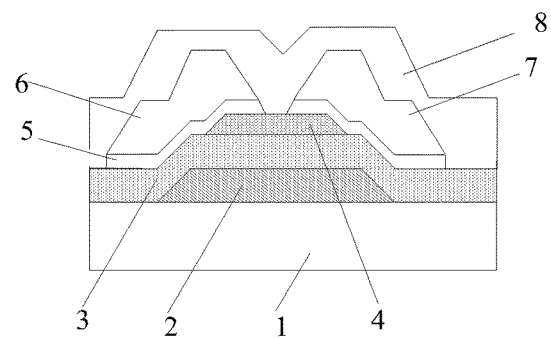
FIG. 6 is a schematic view after forming a passivation layer in the embodiments of the present disclosure.

Because the protective layer 5 is formed of the conductive film with good conductivity (such as, the amorphous carbon film), the source electrode 6 and the drain electrode 7 is electrically connected with each other in the case that the protective layer is continuously disposed below the source electrode 6 and the drain electrode 7, so that the thin film transistor is unable to operate normally. Therefore, in order to avoid the above problem, it is needed to remove the portion of the protective layer 5 between the source electrode and the drain electrode of the thin film transistor after completing the etching process of the source drain metal layer, as illustrated in FIG. 5. For example, the dry etching process is employed to remove the portion of the protective layer 5 between the source electrode and the drain electrode; the oxide semiconductor layer is not damaged in the case that the dry etching process is employed. For example, an oxygen plasma etching process is performed on the portion of the protective layer 5 between the source electrode and the drain electrode of the thin film transistor to remove the portion of the protective layer 5 between the source electrode and the drain electrode of the thin film transistor. The portion of the protective layer 5 between the source electrode and the drain electrode is removed, so that the protective layer 5 provided on the semiconductor layer 4 is not continuous. For example, a pattern formed by etching the protective layer 5 has a same shape and size as those of the source electrode and the drain electrode. Or, the pattern formed by etching the protective layer 5 is different in shape and size from those of the source electrode and the drain electrode, that is, an opening of the protective layer formed by etching the protective layer is smaller than the gap between the source electrode and the drain electrode, and the pattern formed by etching the protective layer 5 extends towards the gap between the source electrode and the drain electrode and covers a portion of the gap between the source electrode and the drain electrode. A size of the opening of the protective layer is a size of the channel of the thin film transistor; in this case, the size of the opening of the protective layer, namely, the size of the channel of the thin film transistor is adjusted by gas flow and etching duration in the dry etching process, and is not limited by process capability for forming via holes and the source and drain electrodes. Therefore, compared with the oxide thin film transistor of ESL type, the size of the channel of the thin film transistor is decreased, which increases the aperture ratio of the array substrate employing the oxide thin film transistor and increases the application of the array substrate employing the oxide thin film transistor in high PPI product.

After the step a5, an annealing treatment is carried out on the base substrate that has underwent the above processes under oxygen atmosphere or in air, so as to form the semiconductor layer 4 that includes the intermediate area corresponding to the gap between the source electrode and the drain electrode, the source area that contacts the source electrode and the drain area that contacts the drain electrode; the intermediate area that corresponds to the gap between the source electrode and the drain electrode is a semiconductor area, and the source area and the drain area are conductor areas. For example, the resistivity of the intermediate area of the semiconductor layer 4 that corresponds to the gap between the source electrode and the drain electrode is 1.06-1.09 $\Omega \cdot m$, and the resistivity of the source area and the drain area of the semiconductor layer 4 is not greater than $1 \times 10^{-5}$ $\Omega \cdot m$.

For example, the source electrode 6 and the drain electrode 7 are formed and the portion of the protective layer 5 between the source electrode 6 and the drain electrode 7 is removed by a single patterning process using one single-tone mask. The source drain metal layer is formed on the protective layer 5, the photoresist is formed on the source drain metal layer, and the photoresist is exposed and developed by using the single-tone mask to form the photoresist-removed-area and the photoresist-retained-area. The photoresist-retained-area correspond to the area in which the source electrode 6 and the drain electrode 7 are to be formed, and the photoresist-removed-area corresponds to other areas. The portion of the source drain metal layer in the photoresist-removed-area and the portion of the protective layer in the photoresist-removed-area are removed by the etching process. For example, in such etching process, the portion of the source drain metal layer in the photoresist-removed-area is firstly removed by using the wet etching process, and then the portion of the protective layer in the photoresist-removed-area is removed by the dry etching process. Finally, the photoresist in the photoresist-retained-area is removed.

The thin film transistor in the embodiments of the present disclosure is obtained by the steps a1-a5. In the embodiments of the present disclosure, the conductive film that does not react with acid solution and is capable of being removed by dry etching is formed on the semiconductor layer to be employed as the protective layer; thus, the protective layer avoids adverse influence of the etching solution for forming the source and drain electrodes on the oxide semiconductor layer, so that the oxide semiconductor is protected by the protective layer. In addition, because the protective layer is conductive, it is not necessary to perform a patterning process on the protective layer to form the via hole connecting the source and drain electrodes with the semiconductor layer; instead, it is only required to remove the portion of the protective layer between the source electrode and the drain electrode of the thin film transistor by dry etching after forming the source electrode and the drain electrode, so as to form the channel of the thin film transistor. The steps a4-a5 are completed by a same patterning process; that is, the source and drain electrode are formed and the protective layer is etched by the same patterning process, and thus the patterning processes for forming the thin film transistor is reduced by one compared with the ESL type thin film transistor.

Hereinafter, in combination with drawings, the array substrate and its fabrication method according to the embodiments of the present disclosure will be introduced in detail. For example, the method for fabricating the array substrate according to the embodiments of the present disclosure include following steps.

Step b1: providing a base substrate 1, and forming a gate electrode 2 and a gate line (not shown) on the base substrate 1;

As illustrate in FIG. 1, the base substrate 1 is provided, and the gate electrode 2 and the gate line connected with the gate electrode 2 are formed by patterning a gate metal layer on the base substrate 1. For example, the base substrate 1 is a glass substrate or a quartz substrate.

For example, a sputtering method or a thermal evaporation method is employed to deposit the gate metal layer with a thickness of 2500-16000 Å, and the gate metal layer is formed of a metal such as Cu (copper), Al (aluminum), Ag (silver), Mo (molybdenum), Cr (chromium), Nd (neodymium), Ni (nickel), Mn (manganese), Ti (titanium), Ta (thallium) and W (wolfram) or an alloy of these metals. For example, the gate metal layer is of a single-layer structure, or the gate metal layer is of a multi-layer structure such as Cu\Mo, Ti\Cu\Ti or Mo\Al\Mo. A photoresist is coated on the gate metal layer, and then the photoresist is exposed and developed by using a single tone mask, so as to form a photoresist-removed-area and a photoresist-retained-area. The photoresist-retained-area corresponds to an area in which the gate electrode and the gate line are to be formed, and the photoresist-removed-area corresponds to other areas. The gate metal layer in the photoresist-removed-area is completely etched off by a etching process, and then the photoresist in the photoresist-retained-area is removed, so that the gate electrode 2 and the gate line are formed.

Step b2: forming a gate insulation layer 3 and a semiconductor layer 4 on the base substrate 1 after step b1;

For example, as illustrated in FIG. 2, a plasma-enhanced chemical vapor deposition (PECVD) method is employed to deposit the gate insulation layer 3 with a thickness of about 2000-6000 Å on the base substrate 1 after the step b1. For example, the gate insulation layer is formed of an oxide, a nitride or an oxynitride, and has a single-layer structure, a double-layer structure or a multi-layer structure. For example, the gate insulation layer is formed of $SiN_x$, $SiO_x$ or $Si(ON)_x$.

For example, a magnetron sputtering method, a thermal evaporation method or other film formation method is employed to deposit a transparent metal oxide semiconductor layer with a thickness of 20-1000 Å on the gate insulation layer 3. The transparent metal oxide semiconductor layer for example is formed of amorphous IGZO, HIZO, InZnO, ZnO, TiO2, SnO, CdSnO or other metal oxide semiconductor material. A photoresist is coated on the transparent metal oxide semiconductor layer and is exposed and developed by using a single tone mask, and the transparent metal oxide semiconductor layer is etched to form the semiconductor layer 4 that is formed of the transparent metal oxide semiconductor.

Step b3: forming a protective layer 5 on the base substrate 1 after the step b2;

For example, the protection layer in the embodiments of the present disclosure has the following properties: it does not react with acid etching solution; it is removed by a dry etching process; and it has good conductivity. For example, the protective layer in the embodiments of the present disclosure is formed of an amorphous carbon film. For example, the amorphous carbon is a graphite-like carbon film; for example, in the graphite-like carbon film, C atoms are mainly in sp2 hybridization state, and the C atoms in sp2 hybridization state has a percentage of 51%-100%.

For example, as illustrated in FIG. 3, a sputtering method is employed to form the amorphous carbon film with a thickness of 10-1000 nm on the base substrate 1 after the step a2. For example, a graphite target with purity greater than 99.99% is employed as a sputtering target of the sputtering process, a vacuum degree in a sputtering chamber is $0.1\text{-}100 \times 10^{-3}$ Pa, a working pressure is 0.1-1 Pa, a gas flow is 25 mL/min (sccm), and a power of the graphite target is 1-2 kW. A resistivity of the amorphous carbon film is $1 \times 10^{-6}\text{-}6 \times 10^{-5}$ Ω·m.

Step b4: forming a data line (not shown), a source electrode 6 and a drain electrode 7 on the base substrate 1 after the step b3;

For example, as illustrated in FIG. 4, a magnetron sputtering method or a thermal evaporation method or other film formation method is employed to deposit a source drain metal layer with a thickness of 2000-6000 Å on the base substrate 1 after the step b3, and the source drain metal layer is formed of a metal such as Cu (copper), Al (aluminum), Ag (silver), Mo (molybdenum), Cr (chromium), Nd (neodymium), Ni (nickel), Mn (manganese), Ti (titanium), Ta (thallium) and W (wolfram) or an alloy of these metals. For example, the source drain metal layer has a single-layer structure; or the source drain metal layer has a multi-layer structure, such as Cu\Mo, Ti\Cu\Ti and Mo\Al\Mo. A photoresist is coated on the source drain metal layer, and the photoresist is exposed and developed by using a single tone mask to form a photoresist-removed-area and a photoresist-retained-area. The photoresist-retained-area correspond to an area in which the data line, the source electrode and the drain electrode are to be formed, and the photoresist-removed-area corresponds to other areas. The source drain metal layer in the photoresist-removed-area is completely etched off by an etching process and the photoresist in the photoresist-retained-area is removed, so that the source electrode 6 and the drain electrode 7 are formed.

In the patterning process, a wet etching process is employed to etch the source drain metal layer to form the data line, the source electrode 6 and the drain electrode 7; under such a case, since the protective layer closely cover the semiconductor layer 4, so that the protective layer prevents acid solution in the wet etching process from damaging the semiconductor layer 4.

Step a5: employing a dry etching process to remove a portion of the protective layer 5 between the source electrode and the drain electrode of the thin film transistor.

Because the protective layer 5 is formed of the conductive film with good conductivity (such as, the amorphous carbon film), the source electrode 6 and the drain electrode 7 is electrically connected with each other in the case that the protective layer is continuously disposed below the source electrode 6 and the drain electrode 7, so that the thin film transistor is unable to operate normally. Therefore, in order to avoid the above problem, it is needed to remove the portion of the protective layer 5 between the source electrode and the drain electrode of the thin film transistor after completing the etching process of the source drain metal layer, as illustrated in FIG. 5. For example, the dry etching process is employed to remove the portion of the protective layer 5 between the source electrode and the drain electrode; the oxide semiconductor layer is not damaged in the case that the dry etching process is employed. For example, an oxygen plasma etching process is performed on the portion of the protective layer 5 between the source electrode and the drain electrode of the thin film transistor to remove the portion of the protective layer 5 between the source electrode and the drain electrode of the thin film transistor. The portion of the protective layer 5 between the source electrode and the drain electrode is removed, so that the protective layer 5 provided on the semiconductor layer 4 is not continuous. For example, a pattern formed by etching the protective layer 5 has a same shape and size as those of the source electrode and the drain electrode. Or, the pattern formed by etching the protective layer 5 is different in shape and size from those of the source electrode and the drain electrode, that is, an opening of the protective layer formed by etching the protective layer is smaller than the gap between the source electrode and the drain electrode, and the pattern formed by etching the protective layer 5 extends towards the gap between the source electrode and the drain electrode and covers a portion of the gap between the source electrode and the drain electrode. A size of the opening of the protective layer is a size of the channel of the thin film transistor; the size of the opening of the protective layer, namely, the size of the channel of the thin film transistor is adjusted by gas flow and etching duration in the dry etching process, and is not limited by process capability for forming via holes and the source and drain electrodes. Therefore, compared with the oxide thin film transistor of ESL type, the size of the channel of the thin film transistor is decreased, which increases the aperture ratio of the array substrate employing the oxide thin film transistor and increases the application of the array substrate employing the oxide thin film transistor in high PPI product.

Step b6: forming a passivation layer 8 including a via hole and a planarization layer 9 including a via hole on the base substrate 1 after the step b5;

For example, a magnetron sputtering method, a thermal evaporation, a plasma-enhanced chemical vapor deposition (PECVD) method or other film formation method is employed to deposit the passivation layer with a thickness of about 400-5000 Å on the base substrate 1 after the step b5. For example, the passivation layer is formed of an oxide, a nitride or an oxynitride. For example, the passivation layer is formed of $SiN_x$, $SiO_x$ or $Si(ON)_x$. For example, the passivation layer has a single-layer structure, or the passivation layer has a double-layer structure formed of silicon nitride and silicon oxide.

For example, a spin coating or other film formation method is employed to deposit an organic photosensitive layer on the passivation layer 8 to form the planarization layer 9. A single tone mask is employed to perform exposure and development on the planarization layer 9, so as to form an organic photosensitive layer removed area and an organic photosensitive layer retained area, with the organic photosensitive layer removed area corresponding to the via hole of the planarization layer and the organic photosensitive layer retained area corresponding to other areas; the passivation layer in the organic photosensitive layer removed area is completely etched off by an etching process to form the via hole of the passivation layer.

In the embodiments of the present disclosure, the planarization layer is provided on the passivation layer; however, the planarization layer may be omitted, that is, the planarization layer may be not provided on the passivation layer.

Step b7: forming a pixel electrode 10 on the base substrate after the step b6.

Figure 7:
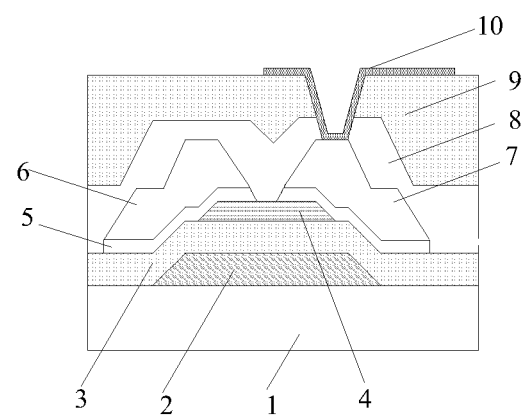
FIG. 7 is a schematic view after forming a pixel electrode in the embodiments of the present disclosure.

For example, as illustrated in FIG. 7, a magnetron sputtering method, a thermal evaporation method or other film formation method is employed to deposit a transparent conductive layer with a thickness of about 20-1000 Å on the base substrate after the step b6. The transparent conductive layer for example is formed of ITO (indium tin oxide) or IZO (indium zinc oxide). A photoresist is coated on the transparent conductive layer and a single tone mask is employed to perform exposure, development and etching on the transparent conductive layer, to form the pixel electrode 10 formed of the transparent conductive layer. Finally, remaining photoresist is removed. The pixel electrode 10 is connected with the drain electrode 7 via the via hole of the planarization layer and the via hole of the passivation layer.

After the step b7, an annealing treatment is carried out on the base substrate that has underwent the above processes under oxygen atmosphere or in air, so as to form the semiconductor layer 4 that includes the intermediate area corresponding to the gap between the source electrode and the drain electrode, the source area that contacts the source electrode and the drain area that contacts the drain electrode; the intermediate area that corresponds to the gap between the source electrode and the drain electrode is a semiconductor area, and the source area and the drain area are conductor areas. For example, the resistivity of the intermediate area of the semiconductor layer 4 that corresponds to the gap between the source electrode and the drain electrode is 1.06-1.09 Ω·m, and the resistivity of the source area and the drain area of the semiconductor layer 4 is not greater than $1 \times 10^{-5}$ Ω·m.

The array substrate according to the embodiments of the present disclosure is obtained by the steps b1-b7. In the embodiments of the present disclosure, the conductive film that does not react with acid solution and is capable of being removed by dry etching is formed on the semiconductor layer to be employed as the protective layer; thus, the protective layer avoids adverse influence of the etching solution for forming the source and drain electrodes on the oxide semiconductor layer, so that the oxide semiconductor is protected by the protective layer. In addition, because the protective layer is conductive, it is not necessary to perform a patterning process on the protective layer to form the via hole connecting the source and drain electrodes with the semiconductor layer; instead, it is only required to remove the portion of the protective layer between the source electrode and the drain electrode of the thin film transistor by dry etching after forming the source electrode and the drain electrode, so as to form the channel of the thin film transistor. The steps b4-b5 are completed by a same patterning process; that is, the source and drain electrode are formed and the protective layer is etched by the same patterning process, and thus the patterning processes for forming the thin film transistor is reduced by one compared with the ESL type thin film transistor.

The foregoing embodiments merely are exemplary embodiments of the disclosure, and not intended to define the scope of the disclosure, and the scope of the disclosure is determined by the appended claims.

This application claims the benefit of Chinese patent application No. 201510236089.6 filled in China on May 11, 2015, which is incorporated by reference herein as a part of this application.

The invention claimed is:

1. A method of fabricating a thin film transistor, comprising:

forming a semiconductor layer;

forming a conductive film that does not react with acid solution on the semiconductor layer to be employed as a protective layer;

forming a source electrode and a drain electrode on the protective layer; and removing a portion of the protective layer between the source electrode and the drain electrode to expose a portion of the semiconductor layer between the source electrode and the drain electrode, wherein the conductive film is an amorphous carbon film.

2. The method of fabricating the thin film transistor according to claim 1, wherein, the amorphous carbon film is a graphite-like carbon film.

3. The method of fabricating the thin film transistor according to claim 2, wherein, in the graphite-like carbon film, C atoms in sp2 hybridization state has a percentage of 51%-100%.

4. The method of fabricating the thin film transistor according to claim 1, wherein, the removing the portion of the protective layer between the source electrode and the drain electrode comprises: removing the portion of the protective layer between the source electrode and the drain electrode comprise by a dry etching process.

5. The method of fabricating the thin film transistor according to claim 1, wherein, the removing the portion of the protective layer between the source electrode and the drain electrode comprise by the dry etching process comprises:
  performing an oxygen plasma etching process on the portion of the protective layer between the source electrode and the drain electrode, to remove the portion of the protective layer between the source electrode and the drain electrode.

6. The method of fabricating the thin film transistor according to claim 1, wherein,
  the forming the conductive film that does not react with acid solution on the semiconductor layer comprises: employing a sputtering process to form the conductive film on the semiconductor layer.

7. The method of fabricating the thin film transistor according to claim 6, wherein, in the sputtering process, a graphite target with purity greater than 99.99% is employed as a sputtering target, a vacuum degree in a sputtering chamber is $0.1\text{-}100\times10^{-3}$ Pa, a working pressure is 0.1-1 Pa, a gas flow is 25 mL/min (sccm), and a power of the graphite target is 1-2 kW.

8. The method of fabricating the thin film transistor according to claim 6, wherein, the semiconductor layer is a metal oxide semiconductor layer.

9. The method of fabricating the thin film transistor according to claim 1, wherein, the forming the source electrode and the drain electrode and the removing the portion of the protective layer between the source electrode and the drain electrode are completed by a same patterning process.

* * * * *